United States Patent
Lee et al.

(10) Patent No.: US 12,069,885 B2
(45) Date of Patent: Aug. 20, 2024

(54) DISPLAY DEVICE AND A METHOD OF MANUFACTURING THE SAME

(71) Applicant: Samsung Display Co., Ltd., Yongin-Si (KR)

(72) Inventors: Jeongmoon Lee, Seoul (KR); Daehong Kim, Seongnam-si (KR); Hyungjin Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 204 days.

(21) Appl. No.: 17/511,702

(22) Filed: Oct. 27, 2021

(65) Prior Publication Data
US 2022/0190293 A1    Jun. 16, 2022

(30) Foreign Application Priority Data
Dec. 10, 2020 (KR) .................. 10-2020-0172620

(51) Int. Cl.
| | | |
|---|---|---|
| H01L 51/52 | (2006.01) | |
| H01L 51/56 | (2006.01) | |
| H10K 50/844 | (2023.01) | |
| H10K 71/00 | (2023.01) | |
| H10K 71/70 | (2023.01) | |
| H10K 59/122 | (2023.01) | |
| H10K 59/124 | (2023.01) | |

(52) U.S. Cl.
CPC ........... *H10K 50/844* (2023.02); *H10K 71/00* (2023.02); *H10K 71/70* (2023.02); *H10K 59/122* (2023.02); *H10K 59/124* (2023.02)

(58) Field of Classification Search
CPC .. H10K 71/70; H10K 50/844; H10K 50/8445; H10K 59/873; H10K 59/8731
See application file for complete search history.

(56) References Cited

U.S. PATENT DOCUMENTS

| | | |
|---|---|---|
| 7,034,404 B1 | 4/2006 | Harada et al. |
| 10,446,793 B2 | 10/2019 | Kim et al. |
| 11,394,006 B2 | 7/2022 | Choi et al. |
| 2019/0341439 A1 | 11/2019 | Choi et al. |

(Continued)

FOREIGN PATENT DOCUMENTS

| | | |
|---|---|---|
| KR | 10-2002-0005601 A | 1/2002 |
| KR | 10-2016-0076006 | 6/2016 |

(Continued)

OTHER PUBLICATIONS

Machine translation, Kim, Korean Pat. Pub. No. KR-2016-0076006A, translation date: Jan. 9, 2024, Espacenet, all pages. (Year: 2024).*

(Continued)

*Primary Examiner* — Ictoria K. Hall
(74) *Attorney, Agent, or Firm* — F. CHAU & ASSOCIATES, LLC

(57) ABSTRACT

A display device including: a substrate; a display element layer disposed on the substrate; a dam disposed around the display element layer; a plurality of patterns disposed between the dam and the display element layer, and a planarization layer disposed on the display element layer and the patterns, wherein the patterns have a hydrophile-lipophile balance value different from a hydrophile-lipophile balance value of the planarization layer.

11 Claims, 15 Drawing Sheets

(56) References Cited

U.S. PATENT DOCUMENTS

2021/0234122 A1* 7/2021 Choi ................. H10K 59/8731
2022/0231257 A1* 7/2022 Wang ................. H10K 59/878

FOREIGN PATENT DOCUMENTS

| KR | 10-2016-0076006 A | * | 6/2016 | ............. H10K 59/00 |
| KR | 10-2018-0039801 | | 4/2018 | |
| KR | 10-2019-0128030 | | 11/2019 | |
| KR | 10-2020-0030163 A | | 3/2020 | |

OTHER PUBLICATIONS

Korean Intellectual Property Office, Request for Submission of an Opinion, Jun. 20, 2024, all pages. (Year: 2024).*

* cited by examiner

FIG. 2
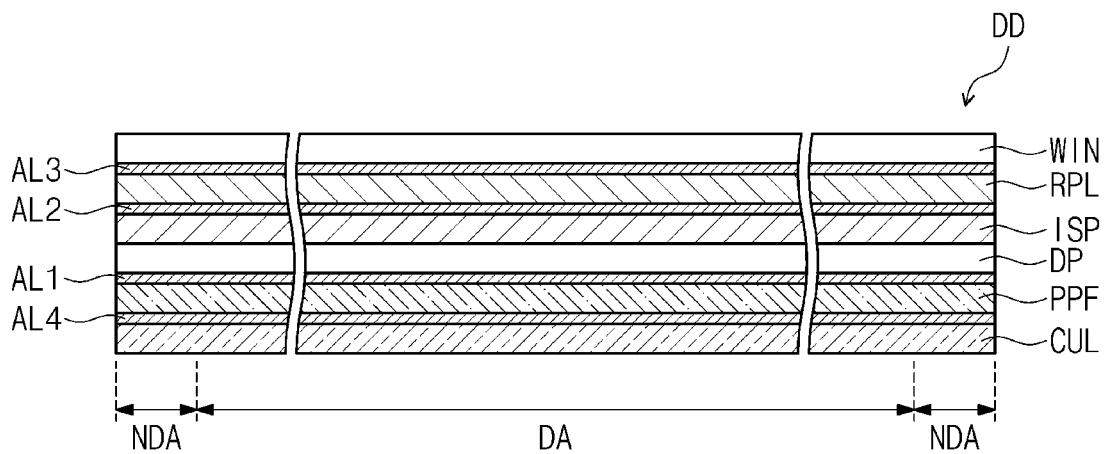
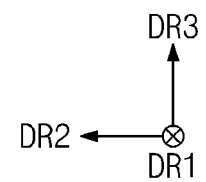
FIG. 3
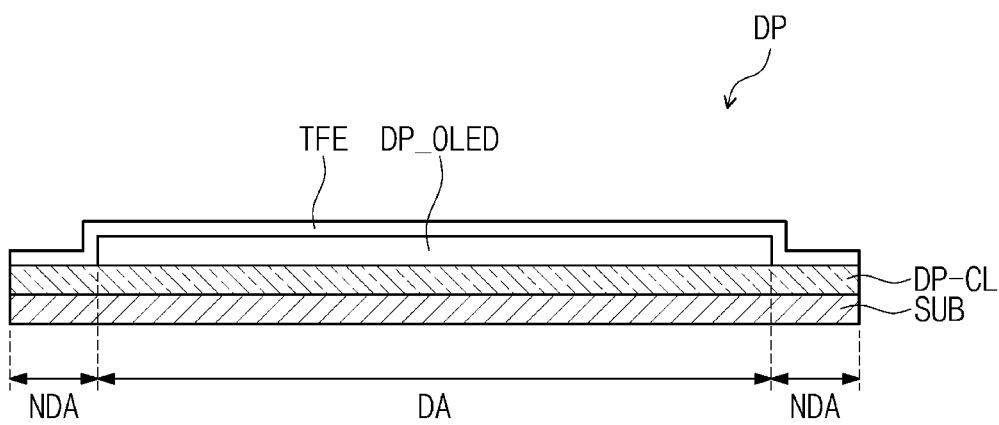
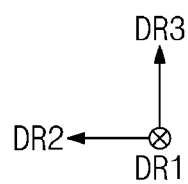

FIG. 7
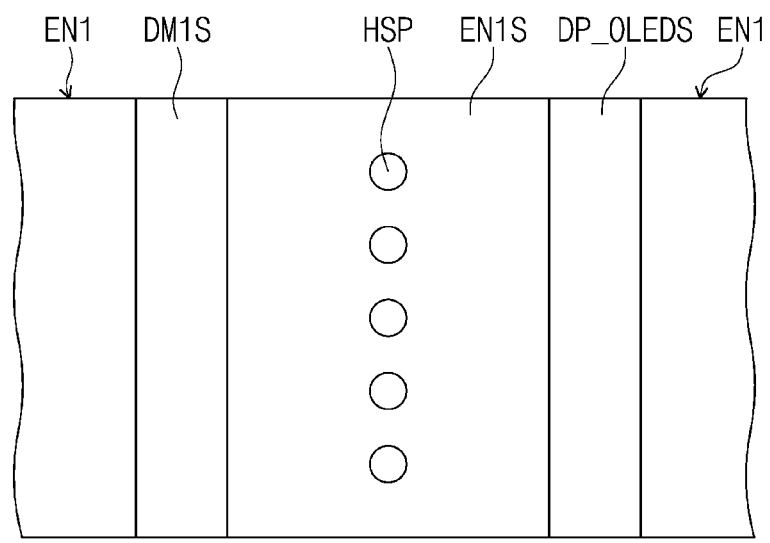
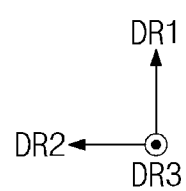

FIG. 15A
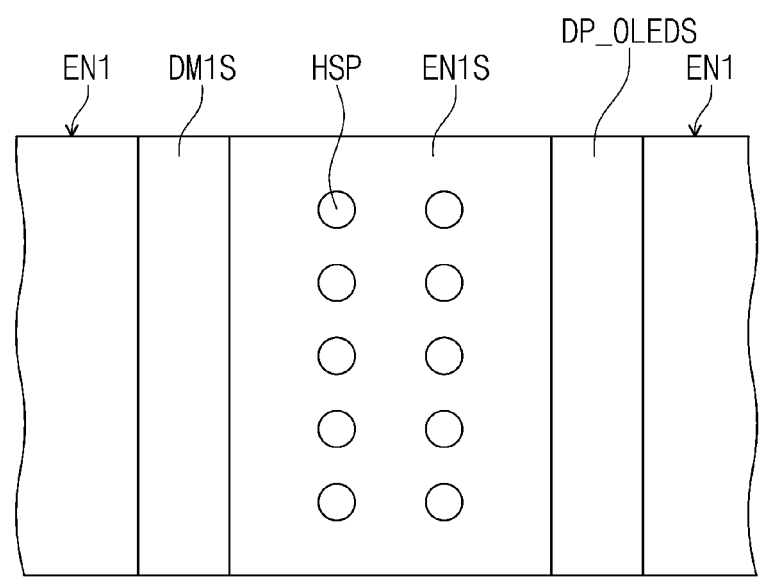
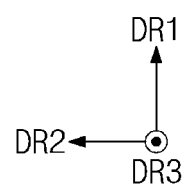

FIG. 15B
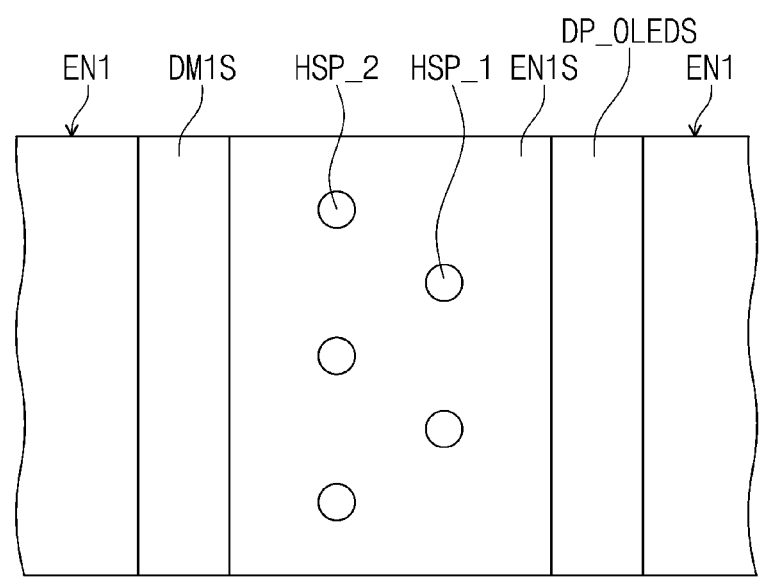
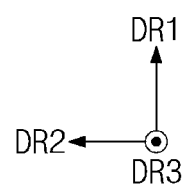

DISPLAY DEVICE AND A METHOD OF MANUFACTURING THE SAME

CROSS-REFERENCE TO RELATED APPLICATION

This U.S. non-provisional patent application claims priority under 35 U.S.C. § 119 to Korean Patent Application No. 10-2020-0172620, filed on Dec. 10, 2020, the disclosure of which is incorporated by reference herein in its entirety.

1. TECHNICAL FIELD

The present disclosure relates to a display device and a method of manufacturing the same. More particularly, the present disclosure relates to a display device including patterns used to determine an organic material overflow and a method of manufacturing the display device.

2. DESCRIPTION OF THE RELATED ART

Electronic devices that provide an image to a user, such as a smartphone, a digital camera, a notebook computer, a navigation unit, and a smart television, include a display device to display the image. The display device generates the image and provides the image to the user through a display screen thereof. In other words, the display device is an output device for presentation of information in visual form.

Among the display devices, an organic light emitting display device displays the image using an organic light emitting element that generates a light using a recombination of electrons and holes. Different from a liquid crystal display device, the organic light emitting display device is self-emissive, and thus, does not require a separate light source. In addition, the organic light emitting display device has superior luminance characteristics and superior viewing angle characteristics in comparison to the liquid crystal display device. In addition, the organic light emitting display device has a fast response speed and a low power consumption.

When the organic light emitting display device is manufactured, pixels respectively including light emitting elements are formed on a substrate, and a thin film encapsulation layer is provided on the substrate to cover the pixels. The thin film encapsulation layer includes an inorganic insulating layer and an organic insulating layer. When forming the organic insulating layer of the thin film encapsulation layer, an organic material with fluidity is provided on the substrate, and then the organic material is cured. When the organic material is excessively coated on the substrate, the organic material may overflow.

SUMMARY

Embodiments of the inventive concept provide a display device including: a substrate; a display element layer disposed on the substrate; a dam disposed around the display element layer; a plurality of patterns disposed between the dam and the display element layer; and a planarization layer disposed on the display element layer and the patterns, wherein the patterns have a hydrophile-lipophile balance value different from a hydrophile-lipophile balance value of the planarization layer.

The display device may further include: a first encapsulation layer disposed on the display element layer; and a second encapsulation layer disposed on the first encapsulation layer, wherein the planarization layer is disposed between the first encapsulation layer and the second encapsulation layer.

The first encapsulation layer and the second encapsulation layer may be disposed on the dam, and the patterns may be spaced apart from each other on the first encapsulation layer.

The planarization layer may be spaced apart from the dam.

A number of the patterns on which the planarization layer is disposed may be equal to or smaller than about 60% of a total number of the patterns.

The patterns may have a lipophilicity, and the planarization layer may have a hydrophilicity.

The hydrophile-lipophile balance value of the planarization layer may be within a range from about 15 to about 20.

The hydrophile-lipophile balance value of the patterns may be within a range from about 0 to about 5.

The patterns may have a hydrophilicity, and the planarization layer may have a lipophilicity.

The patterns may be disposed in a matrix form.

The patterns may include: first patterns disposed adjacent to the display element layer; and second patterns disposed adjacent to the dam, and the first patterns and the second patterns are arranged staggered with respect to one another.

Embodiments of the inventive concept provide a method of manufacturing a display device including: providing a substrate on which a display element layer and a dam around the display element layer are disposed; providing a plurality of patterns between the dam and the display element layer; providing an organic material on the display element layer; and inspecting whether the organic material is disposed on the patterns.

The patterns may have a hydrophile-lipophile balance value different from a hydrophile-lipophile balance value of the organic material.

The encapsulation layer may have a hydrophilicity, and the patterns may have a lipophilicity.

The encapsulation layer may have a lipophilicity, and the patterns may have a hydrophilicity.

The method may further include: providing a first encapsulation layer on the display element layer; providing the organic material on the first encapsulation layer; and curing the organic material.

The inspecting of the organic material may include: using a camera to photograph the patterns and inspecting whether a moiré is present in the photograph; and determining whether a number of the moirés is equal to or smaller than a reference number.

The reference number may be about 60% of a total number of the patterns.

The method may further include determining that the display device is not defective when the number of the moirés is equal to or smaller than the reference number.

The method may further include determining that the display device is defective when the number of the moirés is greater than the reference number.

According to the above embodiments of the inventive concept, the extent of the formation of the planarization layer on a flat surface between the display element layer and the dam may be accurately determined. Since the extent of the formation of the planarization layer is inspected on the flat surface, the planarization layer is prevented from being formed over the dam. Thus, an additional dam structure is not required to prevent the planarization layer from overflowing the dam. As a result, an area for the additional dam structure is not required, and a dead space in the display device is reduced.

BRIEF DESCRIPTION OF THE DRAWINGS

The above and other features of the present disclosure will become readily apparent by reference to the following detailed description when considered in conjunction with the accompanying drawings wherein:

FIG. 2 is a cross-sectional view showing the display device shown in FIG. 1;

FIG. 3 is a cross-sectional view showing a display panel shown in FIG. 2;

FIG. 7 is a plan view showing a portion of a first encapsulation layer including a flat surface shown in FIG. 6;

FIG. 15A is a plan view showing a portion of a first encapsulation layer of FIG. 7 according to an embodiment of the present disclosure; and FIG. 15B is a plan view showing a portion of a first encapsulation layer of FIG. 7 according to an embodiment of the present disclosure.

DETAILED DESCRIPTION OF THE EMBODIMENTS

Figure 1:
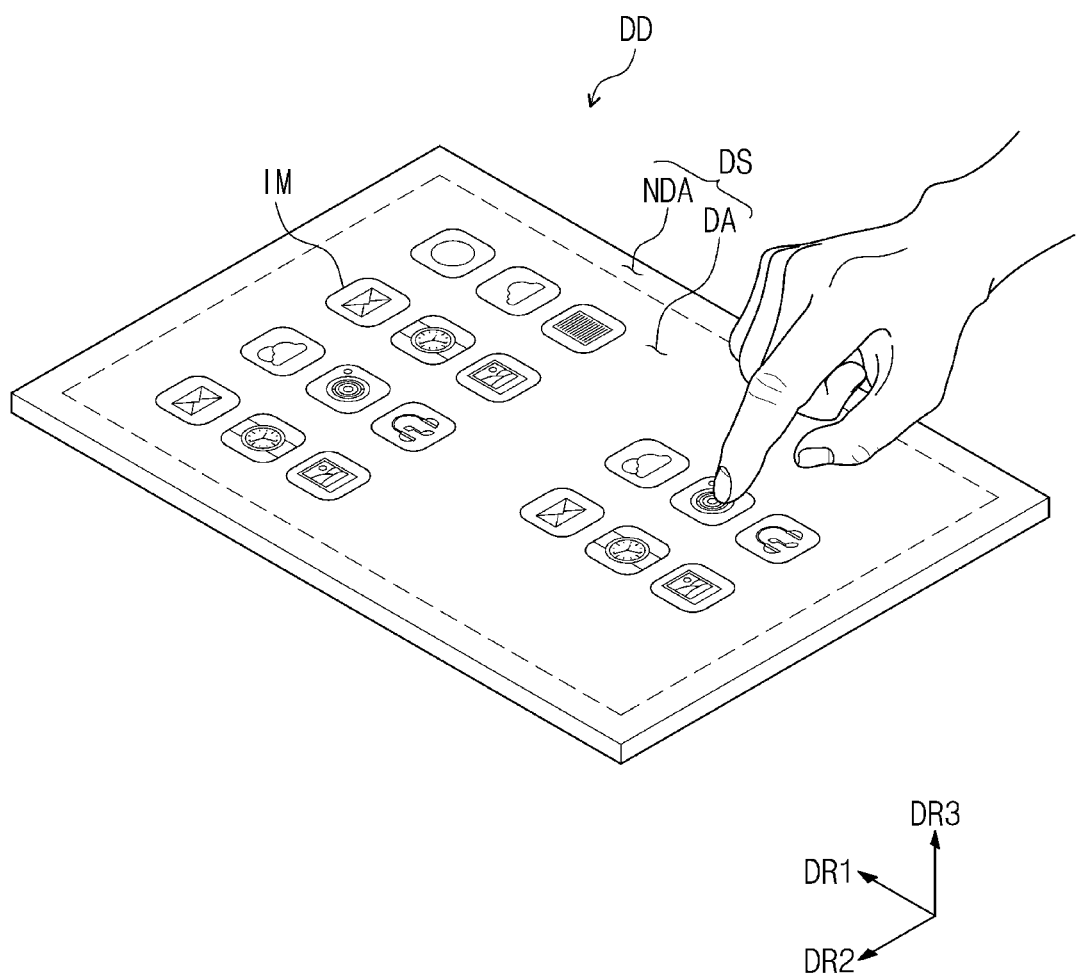
FIG. 1 is a perspective view showing a display device according to an embodiment of the present disclosure.

In the present disclosure, it will be understood that when an element or layer is referred to as being "on", "connected to" or "coupled to" another element or layer, it can be directly on, connected or coupled to the other element or layer or intervening elements or layers may be present. When an element is referred to as being "directly on", "directly connected to", or "directly coupled to" another element or layer, there are no intervening elements or layers present.

Like numerals may refer to like elements throughout the drawings and detailed description. In the drawings, the thickness, ratio, and dimension of components may be exaggerated for effective description of the technical content.

As used herein, the term "and/or" may include any and all combinations of one or more of the associated listed items.

It will be understood that, although the terms first, second, etc. may be used herein to describe various elements, these elements should not be limited by these terms. These terms are used to distinguish one element from another element. Thus, a first element discussed below could be termed a second element. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the present disclosure will be explained in detail with reference to the accompanying drawings.

FIG. 1 is a perspective view showing a display device DD according to an embodiment of the present disclosure.

Referring to FIG. 1, the display device DD according to the embodiment of the present disclosure may have a rectangular shape having long sides extending in a first direction DR1 and short sides extending in a second direction DR2 crossing the first direction DR1. However, the shape of the display device DD should not be limited to the rectangular shape, and the display device DD may have a variety of shapes, such as a circular shape and a polygonal shape.

Hereinafter, a direction substantially perpendicular to a plane formed by the first direction DR1 and the second direction DR2 may be referred to as a "third direction DR3". In the present disclosure, the expression "when viewed in a plane" may be a state of being viewed in the third direction DR3.

An upper surface of the display device DD may be referred to as a display surface DS and may be a plane surface formed by the first direction DR1 and the second direction DR2. Images IM generated by the display device DD may be provided to a user through the display surface DS. In FIG. 1, the images IM are shown as icons that may be opened by a user's touch. In this case, the display device DD may employ a touch screen.

The display surface DS may include a display area DA and a non-display area NDA around the display area DA. The display area DA displays the images IM, and the non-display area NDA does not display the images IM. The non-display area NDA surrounds the display area DA and forms an edge of the display device DD, which is printed by a predetermined color.

The display device DD may be applied to a large-sized electronic item, such as a television set, a monitor, or an outdoor billboard, and a small and medium-sized electronic item, such as a personal computer, a notebook computer, a personal digital assistant, a car navigation unit, a game unit, a smartphone, a tablet computer, and a camera. However, these are merely examples, and the display device DD may be applied to other electronic items.

FIG. 2 is a cross-sectional view showing the display device DD shown in FIG. 1.

Referring to FIG. 2, the display device DD may include a display panel DP, an input sensing part ISP, an anti-reflective layer RPL, a window WIN, a panel protective film PPF, a cushion layer CUL, and first, second, third, and fourth adhesive layers AL1, AL2, AL3, and AL4.

The input sensing part ISP, the anti-reflective layer RPL, and the window WIN may be disposed on the display panel DR. For example, the input sensing part ISP, the second adhesive layer AL2, the anti-reflective layer RPL, the third adhesive layer AL3 and the window WIN may be sequentially disposed on one side of the display panel DP. The panel protective film PPF and the cushion layer CUL may be disposed under the display panel DP. For example, the first adhesive film AL1, the panel protective file PPF, the fourth adhesive film MA and the cushion layer CUL may be sequentially disposed on another side of the display panel DP.

The display panel DP may be a flexible display panel. The display panel DP may include a plurality of electronic components disposed on a flexible substrate. The display panel DP may include a display area DA and a non-display area NDA around the display area DA.

The display panel DP may be a light-emitting type display panel, however, it should not be particularly limited. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod. Hereinafter, the organic light emitting display panel will be described as a representative example of the display panel DP.

The input sensing part ISP may be disposed on the display panel DP. The input sensing part ISP may include a plurality of sensors to sense an external input. The sensors may sense the external input by a capacitive method. The input sensing part ISP may be manufactured directly on the display panel DP when the display panel DP is manufactured. However, it should not be limited thereto or thereby, and the input sensing part ISP may be attached to the display panel DP by an adhesive after being manufactured separately from the display panel DP.

The anti-reflective layer RPL may be disposed on the input sensing part ISP. The anti-reflective layer RPL may be an external light refection preventing film. The anti-reflective layer RPL may reduce a reflectance of the external light incident to the display panel DP from the above of the display device DD. As an example, the anti-reflective layer RPL may include a retarder and/or a polarizer.

The window WIN may be disposed on the anti-reflective layer RPL. The window WIN may protect the display panel DP, the input sensing part ISP, and the anti-reflective layer RPL from external scratches and impacts.

The panel protective film PPF may be disposed under the display panel DP. The panel protective film PPF may be a protective substrate. The panel protective film PPF may protect a lower portion of the display panel DP. The panel protective film PPF may include a flexible plastic material such as polyethylene terephthalate (PET).

The cushion layer CUL may be disposed under the panel protective film PPF. The cushion layer CUL may absorb external impacts applied to a lower portion of the display device DD to protect the display panel DP. The cushion layer CUL may include a foam sheet having a predetermined elasticity.

The first adhesive layer AL1 may be disposed between the display panel DP and the panel protective film PPF. The display panel DP and the panel protective film PPF may be coupled to each other by the first adhesive layer AL1.

The second adhesive layer AL2 may be disposed between the anti-reflective layer RPL and the input sensing part ISP. The anti-reflective layer RPL and the input sensing part ISP may be coupled to each other by the second adhesive layer AL2.

The third adhesive layer AL3 may be disposed between the window WIN and the anti-reflective layer RPL. The window WIN and the anti-reflective layer RPL may be coupled to each other by the third adhesive layer AL3.

The fourth adhesive layer AL4 may be disposed between the panel protective film PFF and the cushion layer CUL. The panel protective film PFF and the cushion layer CUL may be coupled to each other by the fourth adhesive layer AL4.

FIG. 3 is a cross-sectional view showing the display panel DP shown in FIG. 2.

Referring to FIG. 3, the display panel DP may include a substrate SUB, a circuit element layer DP-CL disposed on the substrate SUB, a display element layer DP-OLED disposed on the circuit element layer DP-CL, and an encapsulation layer TFE disposed on the display element layer DP-OLED.

The substrate SUB may include a display area DA and a non-display area NDA around the display area DA. The substrate SUB may include a flexible plastic material. For example, the substrate SUB may include polyimide (PI).

The display element layer DP-OLED may be disposed in the display area DA. The encapsulation layer TFE may be disposed on the circuit element layer DP-CL to cover the display element layer DP-OLED. For example, the encapsulation layer TFE may directly contact the display element layer DP-OLED in the display area DA and directly contact the circuit element layer DP-CL in the non-display area NDA.

A plurality of pixels may be disposed in the circuit element layer DP-CL and the display element layer DP-OLED. Each pixel may include a transistor disposed on the circuit element layer DP-CL and a light emitting element disposed on the display element layer DP-OLED and connected to the transistor. The pixel will be described in detail later.

Figure 4:
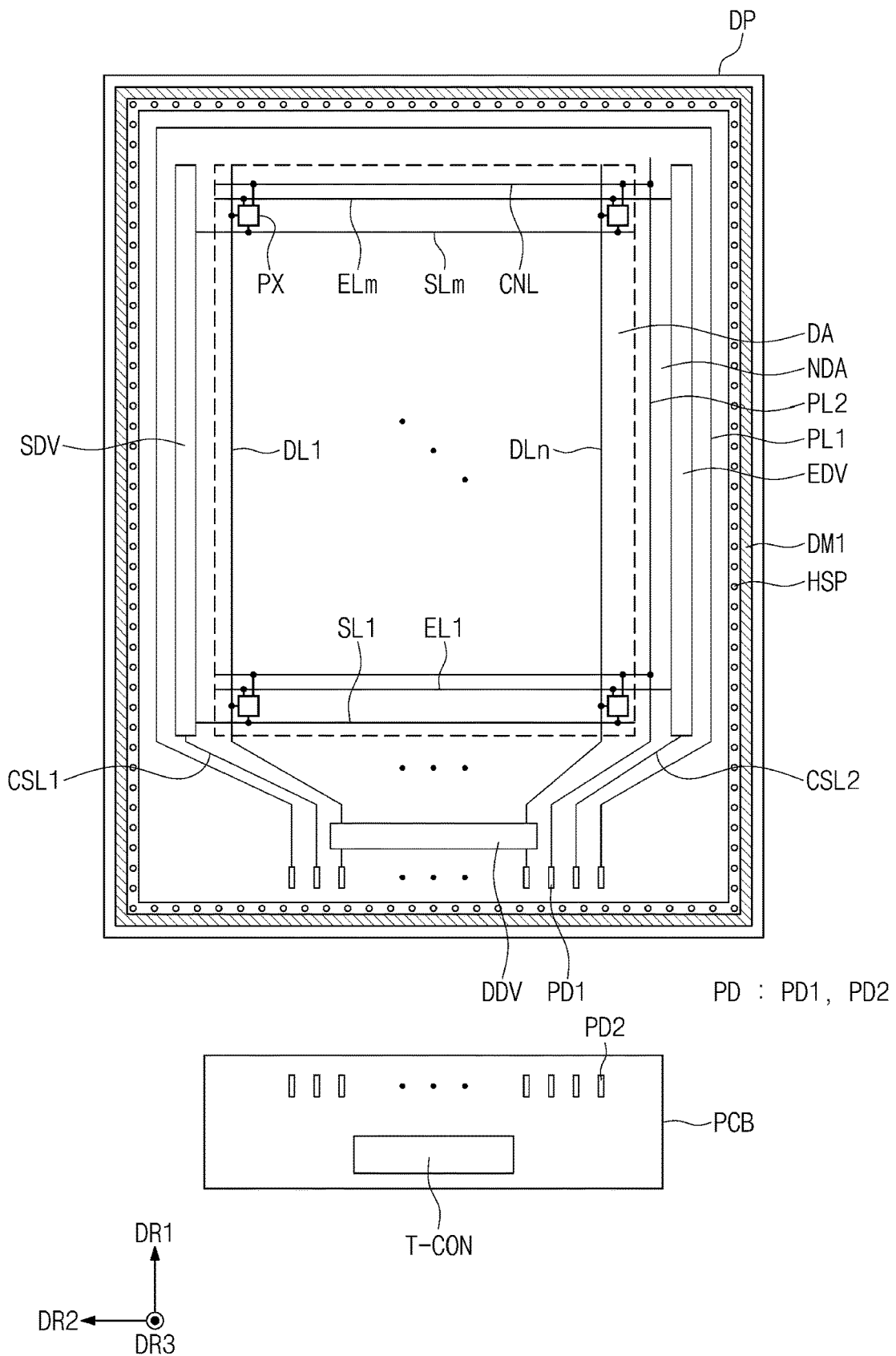
FIG. 4 is a plan view showing the display panel shown in FIG. 3.

FIG. 4 is a plan view showing the display panel DP shown in FIG. 3.

Referring to FIG. 4, the display device DD may include the display panel DP, a scan driver SDV, a data driver DDV, an emission driver EDV, a first dam DM1, patterns HSP, a printed circuit board PCB, and a timing controller T-CON.

The display panel DP may have a rectangular shape having long sides extending in the first direction DR1 and short sides extending in the second direction DR2. The display panel DP may include the display area DA and the non-display area NDA surrounding the display area DA.

The display panel DP may include a plurality of pixels PX, a plurality of scan lines SL1 to SLm, a plurality of data lines DL1 to DLn, a plurality of emission lines ELI to Elm, first and second control lines CSL1 and CSL2, a first power line PL1, a second power line PL2, connection lines CNL, and a plurality of pads PD1 and PD2. Each of "m" and "n" is a natural number. The above-mentioned lines may be disposed on the circuit element layer DP-CL.

The pixels PX may be arranged in the display area DA. The scan driver SDV, the data driver DDV, and the emission driver EDV may be disposed in the non-display area NDA. The scan driver SDV and the emission driver EDV may be disposed in the non-display area NDA to be respectively adjacent to the long sides of the display panel DP. For example, the scan driver SDV and the emission driver EDV may be disposed on opposite sides of the display area DA.

The data driver DDV may be mounted on the display panel DP after being manufactured in an integrated circuit chip. The data driver DDV may be disposed in the non-display area NDA to be adjacent to one short side of the short sides of the display panel DP, however, it should not be limited thereto or thereby. The data driver DDV may be mounted on a flexible circuit board connected to the display panel DP and may be connected to the display panel DP via the flexible circuit board. When viewed in a plane, the data driver DDV may be disposed to be adjacent to a lower end of the display panel DP.

The scan lines SL1 to SLm may extend in the second direction DR2 and may be connected to the pixels PX and the scan driver SDV. The data lines DL1 to DLn may extend in the first direction DR1 and may be connected to the pixels PX and the data driver DDV. The emission lines EL1 to ELm may extend in the second direction DR2 and may be connected to the pixels PX and the emission driver EDV.

The first power line PL1 may be disposed in the non-display area NDA. The first power line PL1 may extend along an edge of the display panel DP. The first power line PL1 may be disposed adjacent to the long sides of the display panel DP. In addition, the first power line PL1 may be disposed adjacent to one short side of the display panel where the data driver DDV is not disposed. For example, the first power line PL1 may be connected to one of the pads PD1 at the lower end of display panel DP and loop around the display area DA and connect to another one of the pads PD1 at the lower end of the display panel DP. The first power line PL1 may be disposed outside the scan driver SDV and the emission driver EDV. For example, the first power line PL1 may be disposed between the emission driver EDV and the patterns HSP. In addition, the first power line PL1 may be disposed between the scan driver SDV and the patterns HSP.

The first power line PL1 may receive a first voltage. The first power line PL1 may extend to the display area DA and may be connected to the pixels PX, and the first voltage may be provided to the pixels PX via the first power line PL1.

The second power line PL2 may extend in the first direction DR1 and may be disposed in the non-display area NDA. The second power line PL2 may be disposed between the display area DA and the emission driver EDV, however, it should not be limited thereto or thereby. The second power line PL2 may be disposed between the display area DA and the scan driver SDV. The second power line PL2 may receive a second voltage having a level higher than that of the first voltage.

The connection lines CNL may extend in the second direction DR2 and may be arranged in the first direction DR1. The connection lines CNL may be connected to the second power line PL2 and the pixels PX. The second voltage may be applied to the pixels PX through the second power line PL2 and the connection lines CNL connected to the second power line PL2.

The first control line CSL1 may be connected to the scan driver SDV and may extend toward the lower end of the display panel DP when viewed in a plane. The second control line CSL2 may be connected to the emission driver EDV and may extend toward the lower end of the display panel DP when viewed in a plane. The data driver DDV may be disposed between the first control line CSL1 and the second control line CSL2.

The pads PD may include a plurality of first pads PD1 disposed on the display panel DP and a plurality of second pads PD2 disposed on the printed circuit board PCB. The data driver DDV, the first power line PL1, the second power line PL2, the first control line CSL1, and the second control line CSL2 may be connected to the first pads PD1.

The data lines DL1 to DLn may be connected to corresponding first pads PD1 among the first pads PD1 via the data driver DDV. For example, the data lines DL1 to DLn may be connected to the data driver DDV, and the data driver DDV may be connected to the first pads PD1 respectively corresponding to the data lines DL1 to DLn.

The first dam DM1 may surround the display area DA and may be disposed in the non-display area NDA. In detail, the first dam DM1 may extend along the edge of the display panel DP to surround the scan driver SDV, the data driver DDV, and the emission driver EDV. For example, the first dam DM1 may be disposed along opposite long sides of the display panel DP and opposite short sides of the display panel DP. As an example, one first dam DM1 will be described, however, the number of the first dams DM1 should not be limited to one. The first dam DM1 will be described in detail later with reference to FIG. 6.

The patterns HSP may surround the display area DA and may be disposed in the non-display area NDA. The patterns HSP may be disposed adjacent to the first dam DM1. The patterns HSP may be in contact with the first dam DM1. In detail, the patterns HSP may extend along the edge of the display panel DP to surround the scan driver SDV, the data driver DDV, and the emission driver EDV. Like the first dam DM1, the patterns HSP may be disposed along opposite long sides of the display panel DP and opposite short sides of the display panel DP. As an example, the patterns HSP may have a predetermined size and may be arranged at predetermined intervals, however, they should not be limited thereto or thereby. The patterns HSP may have various sizes and may be arranged at various intervals. The patterns HSP will be described in detail later.

A timing controller T-CON may be disposed on the printed circuit board PCB. The timing controller T-CON may be mounted on the printed circuit board PCB after being manufactured in an integrated circuit chip.

The second pads PD2 may be disposed at one side of the printed circuit board PCB adjacent to the display panel DP. The second pads PD2 may be connected to the first pads PD1. The flexible circuit board (not shown) may be connected to the first pads PD1 and the second pads PD2 and may connect the printed circuit board PCB and the display panel DP.

The timing controller T-CON may be connected to corresponding second pads PD2 among the second pads PD2. The timing controller T-CON may be connected to the data driver DDV and the first pads PD1 connected to the first and second control lines CSL1 and CSL2 via the corresponding second pads PD2.

A voltage generator may be disposed on the printed circuit board PCB and may be connected to corresponding second pads PD2 among the second pads PD2. The voltage generator may be connected to the first pads PD1 connected to the first and second control lines CSL1 and CSL2 via the corresponding second pads PD2.

The timing controller T-CON may control an operation of the scan driver SDV, the data driver DDV, and the emission driver EDV. The timing controller T-CON may generate a scan control signal, a data control signal, and an emission control signal in response to control signals applied thereto.

The scan control signal may be applied to the scan driver SDV via the first control line CSL1. The emission control signal may be applied to the emission driver EDV via the second control line CSL2. The data control signal may be applied to the data driver DDV. The timing controller T-CON may receive image signals from an external source, may convert a data format of the image signals to a data format appropriate to an interface between the data driver DDV and the timing controller T-CON, and may apply the image signals having the converted data format to the data driver DDV.

The scan driver SDV may generate a plurality of scan signals in response to the scan control signal. The scan signals may be applied to the pixels PX via the scan lines SL1 to SLm. The scan signals may be sequentially applied to the pixels PX.

The data driver DDV may generate a plurality of data voltages corresponding to the image signals in response to the data control signal. The data voltages may be applied to the pixels PX via the data lines DL1 to DLn. The emission driver EDV may generate a plurality of emission signals in response to the emission control signal. The emission signals may be applied to the pixels PX via the emission lines EL1 to ELm.

The pixels PX may receive the data voltages in response to the scan signals. The pixels PX may emit a light having a luminance corresponding to the data voltages in response to the emission signals, and thus, the image may be displayed. An emission time of the pixels PX may be controlled by the emission signals.

Figure 5:
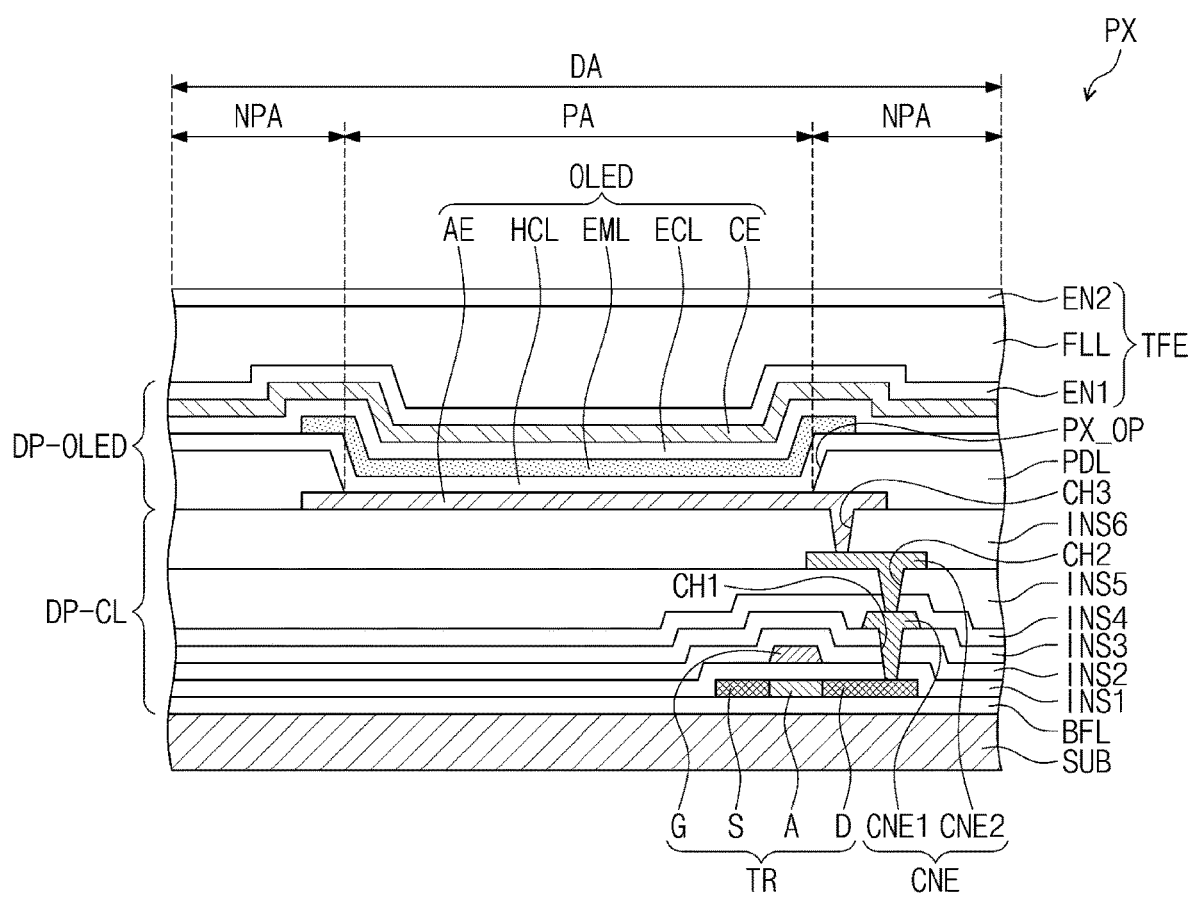
FIG. 5 is a cross-sectional view showing a pixel shown in FIG. 4.

FIG. 5 is a cross-sectional view showing the pixel PX shown in FIG. 4.

Referring to FIG. 5, the pixel PX may include a transistor TR and a light emitting element OLED. The light emitting element OLED may include a first electrode AE, a second electrode CE, and a hole control layer HCL, an electron control layer ECL, and a light emitting layer EML. The first electrode AE may be an anode electrode, and the second electrode CE may be a cathode electrode.

The transistor TR and the light emitting element OLED may be disposed on the substrate SUB. As an example, one transistor TR is shown in FIG. 5, however, the pixel PX may include a plurality of transistors and at least one capacitor to drive the light emitting element OLED.

The display area DA may include a light emitting area PA corresponding to each pixel PX and a non-light-emitting area NPA around the light emitting area PA. The light emitting element OLED may be disposed in the light emitting area PA.

A buffer layer BFL may be disposed on the substrate SUB, and the buffer layer BFL may be an inorganic layer. A semiconductor pattern may be disposed on the buffer layer BFL. The semiconductor pattern may include a polycrystalline silicon, however, it should not be limited thereto or thereby. The semiconductor pattern may include amorphous silicon or metal oxide.

The semiconductor pattern may have different electrical properties depending on whether it is doped or not and whether it is doped with a P-type dopant or an N-type dopant. The semiconductor pattern may include a doped region and a non-doped region. The doped region may be doped with the N-type dopant or the P-type dopant. The doped region may have a conductivity greater than that of the non-doped region and may serve as a source electrode and a drain electrode of the transistor TR. The non-doped region may correspond to an active (or a channel) of the transistor TR.

A source S, an active A, and a drain D of the transistor TR may be formed from the semiconductor pattern. A first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

A connection electrode CNE may be disposed between the transistor TR and the light emitting element OLED to connect the transistor TR to the light emitting element OLED. The connection electrode CNE may include a first connection electrode CNE1 and a second connection electrode CNE2.

The first connection electrode CNE1 may be disposed on the third insulating layer INS3 and may be connected to the drain D through a first contact hole CH1 formed through the first, second, and third insulating layers INS1, INS2, and INS3. A fourth insulating layer INS4 may be disposed on the first connection electrode CNE1. A fifth insulating layer INS5 may be disposed on the fourth insulating layer INS4. The second connection electrode CNE2 may be disposed on the fifth insulating layer INS5. The second connection electrode CNE2 may be connected to the first connection electrode CNE1 through a second contact hole CH2 formed through the fifth insulating layer INS5.

A sixth insulating layer INS6 may be disposed on the second connection electrode CNE2. Layers from the buffer layer BFL to the sixth insulating layer INS6 may be referred to as the circuit element layer DP-CL. Each of the first to sixth insulating layers INS1 to INS6 may be an inorganic layer or an organic layer.

The first electrode AE may be disposed on the sixth insulating layer INS6. The first electrode AE may be connected to the second connection electrode CNE2 through a third contact hole CH3 formed through the sixth insulating layer INS6. A pixel definition layer PDL may be disposed on the first electrode AE and the sixth insulating layer INS6 to expose a predetermined portion of the first electrode AE. The pixel definition layer PDL may be provided with an opening PX_OP provided therethrough to expose the portion of the first electrode AE.

The hole control layer HCL may be disposed on the first electrode AE and the pixel definition layer PDL. For example, the hole control layer HCL may directly contact the first electrode AE in the light emitting area PA and directly contact the pixel definition layer PDL in the non-light emitting area NPA. The hole control layer HCL may be commonly disposed in the light emitting area PA and the non-light-emitting area NPA. The hole control layer HCL may include a hole transport layer and a hole injection layer.

The light emitting layer EML may be disposed on the hole control layer HCL. The light emitting layer EML may be disposed in an area corresponding to the opening PX_OP. However, the light emitting layer EML may extend beyond the opening PX_OP into the non-light emitting area NPA. The light emitting layer EML may include an organic material and/or an inorganic material. The light emitting layer EML may generate a first light. The first light may be a blue light.

The electron control layer ECL may be disposed on the light emitting layer EML and the hole control layer HCL. The electron control layer ECL may be commonly disposed in the light emitting area PA and the non-light-emitting area NPA. The electron control layer ECL may contact the hole control layer HCL in the non-light-emitting area NPA. The electron control layer ECL may include an electron transport layer and an electron injection layer.

The second electrode CE may be disposed on the electron control layer ECL. The second electrode CE may be commonly disposed in the pixels PX. A layer on which the light emitting element OLED is disposed may be referred to as the display element layer DP_OLED.

The encapsulation layer TFE may be disposed on the second electrode CE to cover the pixel PX. The encapsulation layer TFE may include a planarization layer FLL disposed on the second electrode CE, a first encapsulation layer EN1 disposed under the planarization layer FLL, and a second encapsulation layer EN2 disposed on the planarization layer FLL. Here, the first encapsulation layer EN1 may be in direct contact with the second electrode CE in both the light emitting area PA and the non-light emitting area NPA.

The planarization layer FLL may be an organic layer, and each of the first and second encapsulation layers EN1 and EN2 may be an inorganic layer. The planarization layer FLL may protect the pixel PX from a foreign substance such as dust particles. The first and second encapsulation layers EN1 and EN2 may protect the pixel PX from moisture and oxygen. The first and second encapsulation layers EN1 and EN2 may surround the planarization layer FLL.

The first voltage may be applied to the first electrode AE through the transistor TR, and the second voltage may be applied to the second electrode CE. Holes and electrons injected into the light emitting layer EML may be combined to generate excitons, and the light emitting element OLED may emit the light by the excitons that return to a ground state from an excited state.

Figure 6:
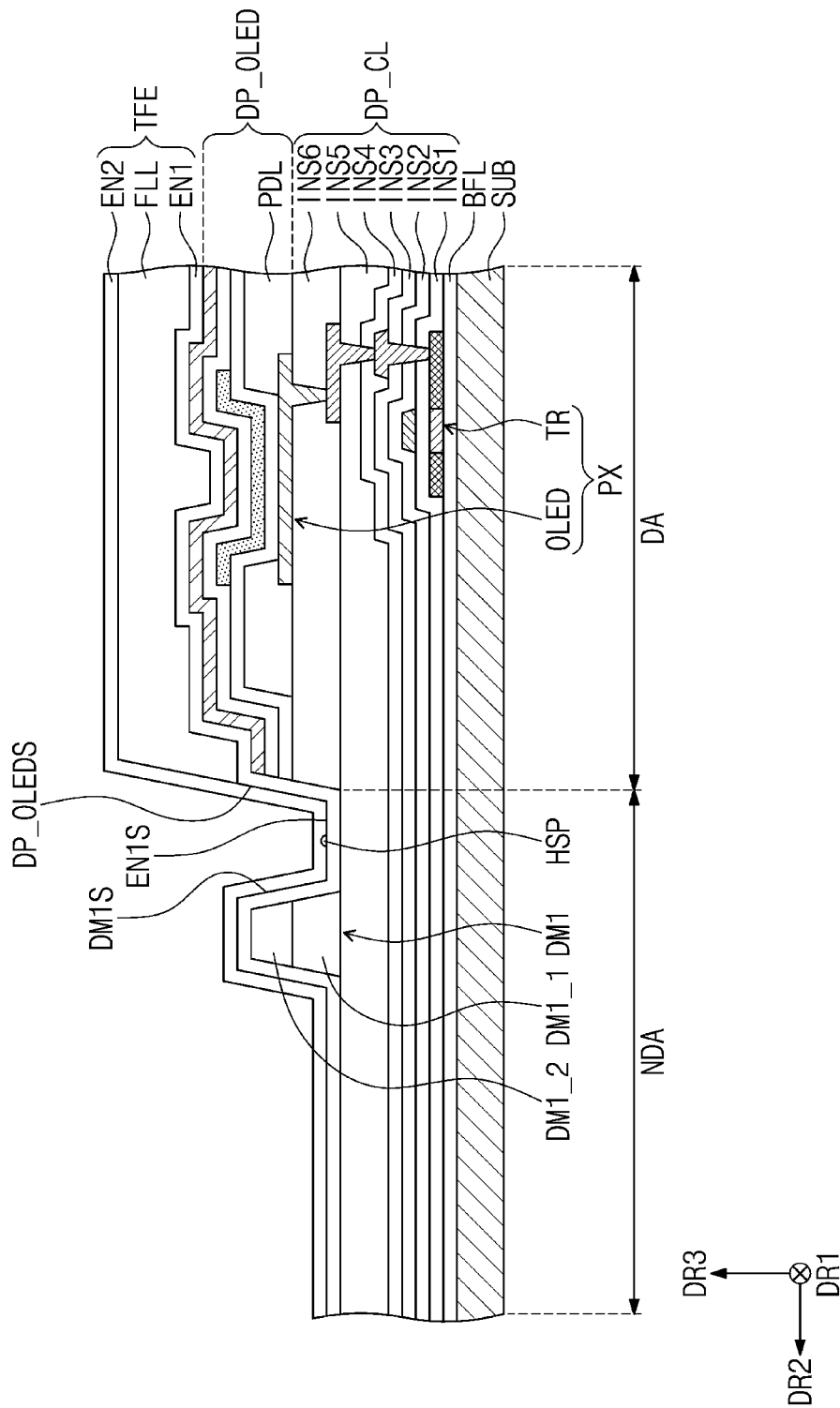
FIG. 6 is a cross-sectional view showing the display panel corresponding to a non-display area and a display area adjacent to the non-display area shown in FIG. 3.

FIG. 6 is a cross-sectional view showing the display panel corresponding to the non-display area and the display area adjacent to the non-display area shown in FIG. 3.

Referring to FIG. 6, the buffer layer BFL and the first to fifth insulating layers INS1 to INS5 disposed in the display area DA of the substrate SUB may extend to the non-display area NDA of the substrate SUB. The sixth insulating layer INS6 and the pixel definition layer PDL may be disposed in the display area DA. For example, the sixth insulating layer INS6 and the pixel definition layer PDL may not extend to the non-display area NDA. The pixel PX may be disposed on the buffer layer BFL.

The display panel DP may include the first dam DM1 disposed in the non-display area NDA. The first dam DM1 may be disposed on the fifth insulating layer INS5. The first dam DM1 may be disposed adjacent to the display area DA. However, the first dam DM1 may be spaced apart from the display area DA by a certain distance. The first dam DM1 may be disposed around the display element layer DP_OLED.

The first dam DM1 may include a plurality of layers stacked one on another. The first dam DM1 may include a first dam insulating layer DM1_1 and a second dam insulating layer DM1_2 disposed on the first dam insulating layer DM1_1.

The first and second dam insulating layers DM1_1 and DM1_2 may include an organic material. The first and second dam insulating layers DM1_1 and DM1_2 may be formed of the same material as the sixth insulating layer INS6 or the pixel definition layer PDL; however, they should not be limited thereto or thereby. In other words, the first and second dam insulating layers DM1_1 and DM1_2 may include another organic material.

The encapsulation layer TFE disposed in the display area DA to cover the pixel PX may extend to the non-display area NDA. For example, the first and second encapsulation layers EN1 and EN2 of the encapsulation layer TFE may extend to the non-display area NDA to overlap the first dam DM1. The planarization layer FLL may be disposed on the substrate SUB. In detail, the planarization layer FLL may be disposed on the display element layer DP_OLED and the patterns HSP. The planarization layer FLL may be disposed on some patterns of the patterns HSP.

The first encapsulation layer EN1 may be disposed under the planarization layer FLL, and the second encapsulation layer EN2 may be disposed on the planarization layer FLL. Accordingly, the planarization layer FLL may be disposed between the first encapsulation layer EN1 and the second encapsulation layer EN2.

The first encapsulation layer EN1 disposed on the display element layer DP_OLED may extend to the non-display area NDA. The first encapsulation layer EN1 disposed in the non-display area NDA may be disposed on the fifth insulating layer INS5 and the first dam DM1. In detail, the first encapsulation layer EN1 may extend to the first dam DM1 and may be disposed on the fifth insulating layer INS5 to cover the first dam DM1.

When viewed in a plane, the planarization layer FLL may be disposed on the first encapsulation layer EN1 to overlap the display area DA. The planarization layer FLL may be disposed on the display element layer DP_OLED. Accordingly, when viewed in a plane, the planarization layer FLL may be spaced apart from the first dam DM1 and may be disposed to overlap the display element layer DP_OLED. For example, the planarization layer FLL may be spaced apart from the first dam DM1 by a certain distance.

The planarization layer FLL may be formed by curing an organic material having fluidity. The planarization layer FLL may be disposed on the first encapsulation layer EN1 disposed on the display element layer DP_OLED.

As an example, the planarization layer FLL may be disposed only on the display element layer DP_OLED, however, the present disclosure should not be limited thereto or thereby. For example, the planarization layer FLL may be provided in the non-display area NDA in a case where the organic material having the fluidity flows to the non-display area NDA, however, the organic material may be blocked by the first dam DM1. In this case, the planarization layer FLL may be placed up to the first dam DM1.

In addition, in a case where the organic material having the fluidity flows between the first dam DM1 and the display element layer DP_OLED, the planarization layer FLL may be disposed between the first dam DM1 and the display element layer DP_OLED. For example, the planarization layer FLL may overlap a pattern HSP in a space provided between the first dam DM1 and the display area DA. This structure will be described in detail with reference to FIG. 8.

The second encapsulation layer EN2 may be disposed on the first encapsulation layer EN1 to cover the planarization layer FLL. The second encapsulation layer EN2 disposed on the planarization layer FLL may extend to the non-display area NDA. In detail, the second encapsulation layer EN2 may extend to the first dam DM1 and may be disposed on the first encapsulation layer EN1 to cover the first dam DM1.

The first encapsulation layer EN1 may include a first inclined surface DM1S, a flat surface EN1S, and a second inclined surface DP_OLEDS. The first inclined surface DM1S may be an inclined surface that is inclined from the first encapsulation layer EN1 on the fifth insulating layer INS5 to the first encapsulation layer EN1 on the first dam DM1. The second inclined surface DP_OLEDS may be an inclined surface that is inclined from the first encapsulation layer EN1 on the fifth insulating layer INS5 to the first encapsulation layer EN1 on the display element layer DP_OLED. The flat surface EN1S may be disposed between the first inclined surface DM1S and the second inclined surface DP_OLEDS.

The patterns HSP may be disposed on the first encapsulation layer EN1. The patterns HSP may be provided between the first encapsulation layer EN1 and the second encapsulation layer EN2. The patterns HSP may be disposed between the first dam DM1 and the display element layer DP_OLED. The patterns HSP may be disposed on the flat surface EN1S.

As described above, in the case where the planarization layer FLL is disposed only on the display element layer DP_OLED, the planarization layer FLL may not be disposed on the patterns HSP. Here, the second encapsulation layer EN2 may be disposed on the patterns HSP.

However, as described above, in the case where the planarization layer FLL is disposed between the display element layer DP_OLED and the first dam DM1, the planarization layer FLL may be disposed on the patterns HSP. This structure will be described in detail with reference to FIG. 9.

The patterns HSP may include a material different from the planarization layer FLL. When the patterns HSP are in contact with the planarization layer FLL, a moiré pattern caused by a light refraction may be formed in the patterns HSP. The moiré pattern may be photographed by a camera. When the moiré pattern formed in the patterns HSP is checked, it can be determined whether the patterns HSP are in contact with the planarization layer FLL. These processes will be described in detail later. In addition, the patterns HSP will be described in detail with reference to FIG. 9.

An embodiment of the inventive concept provides a display device including: a substrate SUB; a display element layer DP-OLED disposed on the substrate SUB; a dam DM1 disposed around the display element layer DP-OLED; a plurality of patterns HSP disposed between the dam DM1 and the display element layer DP-OLED; and a planarization layer FLL disposed on the display element layer DP-OLED and the patterns HSP. The patterns HSP have a hydrophile-lipophile balance value different from a hydrophile-lipophile balance value of the planarization layer, as described with reference to FIG. 9 below.

FIG. 7 is a plan view showing a portion of the first encapsulation layer including the flat surface shown in FIG. 6.

FIG. 7 shows five patterns HSP as a representative example, however, the number of the patterns HSP should not be limited to five. For example, the number of the patterns HSP may be less or greater than five.

Referring to FIG. 7, the patterns HSP may be disposed on the flat surface EN1S between the first and second inclined surfaces DM1S and DP_OLEDS. The patterns HSP may be arranged in first direction DR1 at regular intervals on the flat surface EN1S, however, they should not be limited thereto or thereby. For instance, the patterns HSP may be arranged at random intervals. In addition, the patterns may also be arranged in the second direction DR2.

When viewed in a plane, the patterns HSP may have a circular shape and may have a hemispherical shape protruded to the third direction DR3, however, they should not be limited thereto or thereby. In other words, the patterns HSP may have a variety of shapes.

Figure 8:
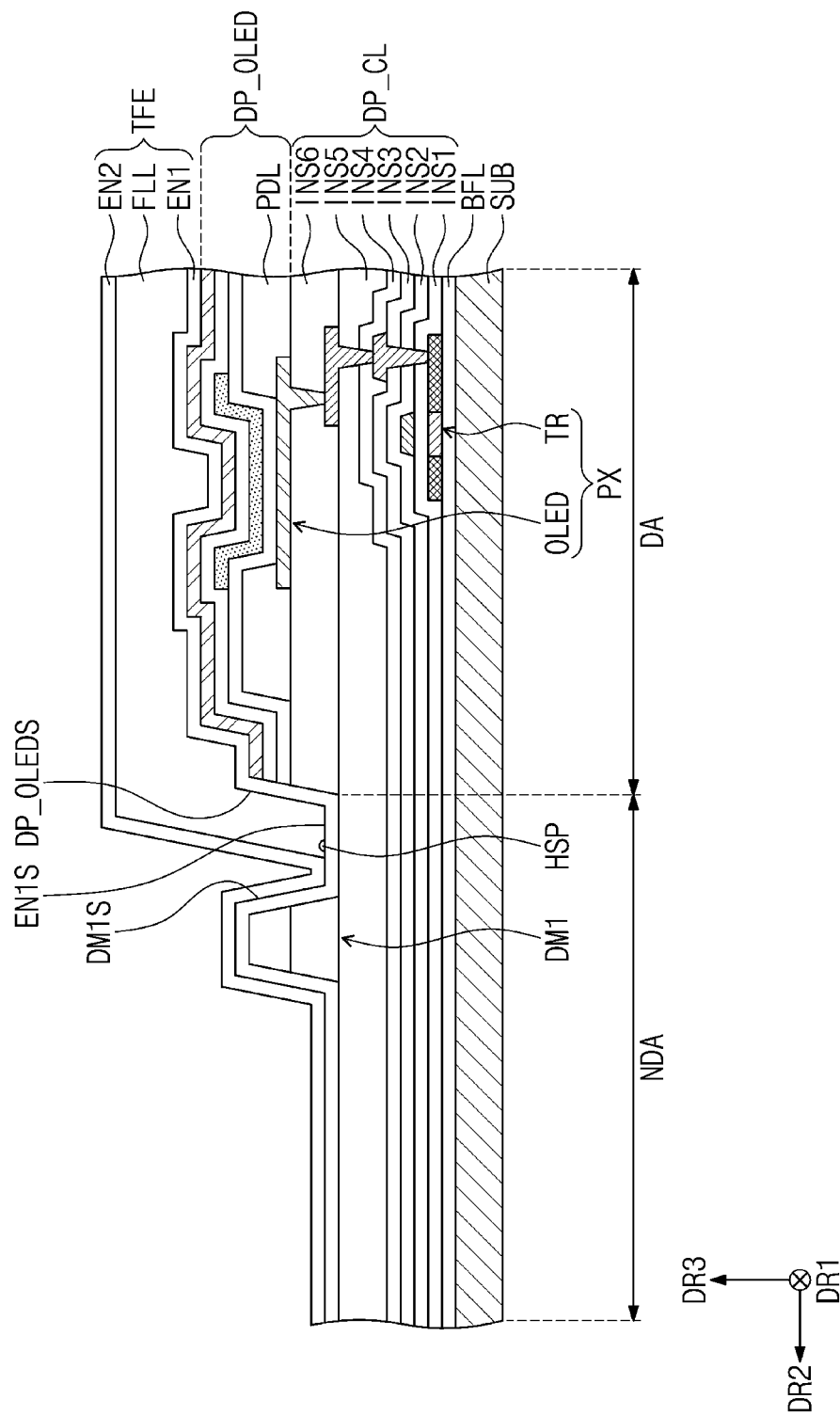
FIG. 8 is a cross-sectional view showing a planarization layer shown in FIG. 6 and disposed on patterns.

FIG. 8 is a cross-sectional view showing the planarization layer shown in FIG. 6 and disposed on the patterns.

Referring to FIG. 8, the planarization layer FLL may be formed to extend to the non-display area NDA from the display area DA on the first encapsulation layer EN1. The planarization layer FLL may be formed beyond the second inclined surface DP_OLEDS and onto a portion of the flat surface EN1S. The planarization layer FLL may cover the patterns HSP provided on the flat surface EN1S.

The area in which the planarization layer FLL is disposed may be identified by the patterns HSP. The area in which the planarization layer FLL is disposed may be identified by checking whether the moiré pattern of the patterns HSP is formed. This process will be described in detail later.

Figure 9:
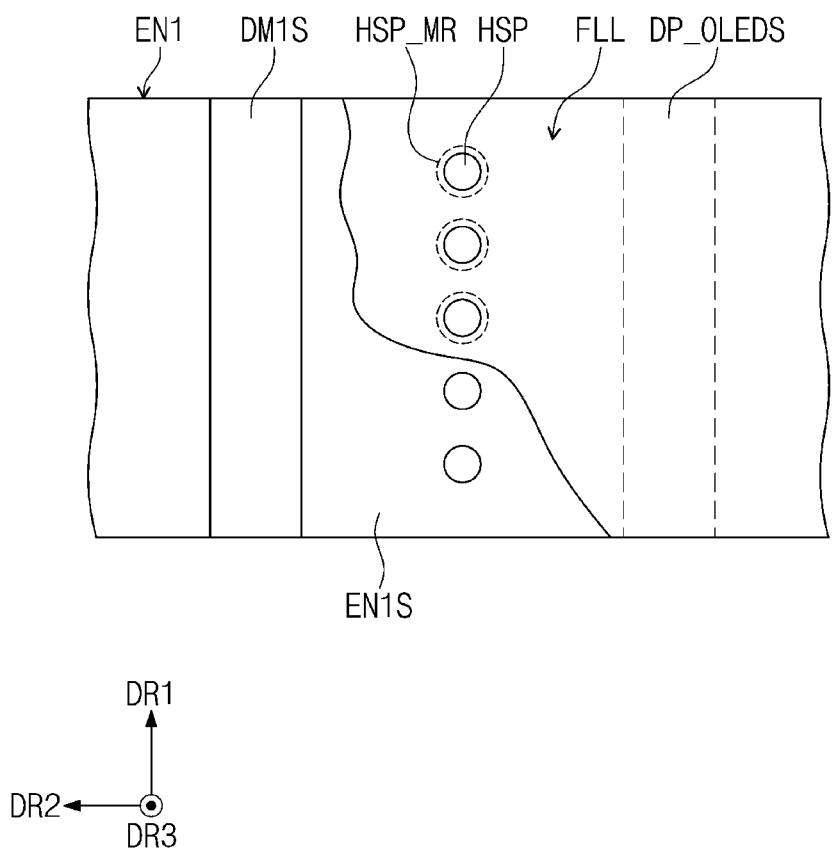
FIG. 9 is a plan view showing a planarization layer disposed to cover some of the patterns on the flat surface shown in FIG. 8.

FIG. 9 is a plan view showing the planarization layer disposed to cover some of the patterns on the flat surface shown in FIG. 7.

FIG. 9 shows five patterns HSP as a representative example, and the planarization layer FLL is disposed to cover three of the five patterns HSP. However, it should not be limited thereto or thereby, and the planarization layer FLL may be disposed to cover two patterns HSP or less or four patterns HSP or more, or as shown in FIG. 6 the planarization layer FLL may not cover the patterns HSP.

Referring to FIG. 9, the planarization layer FLL may be formed on the display element layer DP_OLED and may extend in the second direction DR2 and to cover a portion of the flat surface EN1S after crossing the second inclined surface DP_OLEDS. The planarization layer FLL may irregularly cover the flat surface EN1S on the first encapsulation layer EN1 in the second direction DR2. For example, the demarcation between the planarization layer FLL and the flat surface EN1S may be irregular as shown in FIG. 9.

The planarization layer FLL may include a material having a hydrophile-lipophile balance value different from that of the patterns HSP. The planarization layer FLL may include the material having the hydrophile-lipophile balance value that is within a range from about 15 to about 20. The planarization layer FLL may include an acrylic-based material, however, it should not be limited thereto or thereby. In other words, the planarization layer FLL may include a variety of hydrophilic substances and lipophilic substances.

The patterns HSP may include a lipophilic substance. The patterns HSP may include the material having the hydrophile-lipophile balance value that is within a range from about 0 (zero) to about 5. The patterns HSP may include a hydrophobic substance such as a mineral oil, however, they should not be limited thereto or thereby. The patterns HSP may include various lipophilic substances and hydrophilic substances.

The patterns HSP may form a moiré pattern HSP_MR when making contact with the planarization layer FLL. When viewed in a plane, circular patterns may be formed around the patterns HSP including the material different from that of the planarization layer FLL. The moiré pattern HSP_MR may be formed due to a difference in light reflection and refractive index at an interface between the planarization layer FLL and the patterns HSP, which include different materials from each other.

The patterns HSP may form the moiré pattern HSP_MR at a contact portion between the patterns HSP and the planarization layer FLL and may not form the moiré pattern HSP_MR at a portion where the patterns HSP are not in contact with the planarization layer FLL. For example, three moiré patterns HSP_MR are formed in FIG. 9 where the patterns HSP are in contact with the planarization layer FLL. Since the other two patterns HSP are not in contact with the planarization layer FLL, they do not form moiré patterns HSP_MR. Accordingly, it can be determined whether the patterns HSP are in contact with the planarization layer FLL by checking whether the moiré pattern HSP_MR is formed.

FIGS. 10, 11, 12, 13, and 14 are views explaining a process of inspecting whether the planarization layer is formed on patterns when the first encapsulation layer is formed.

Figure 10:
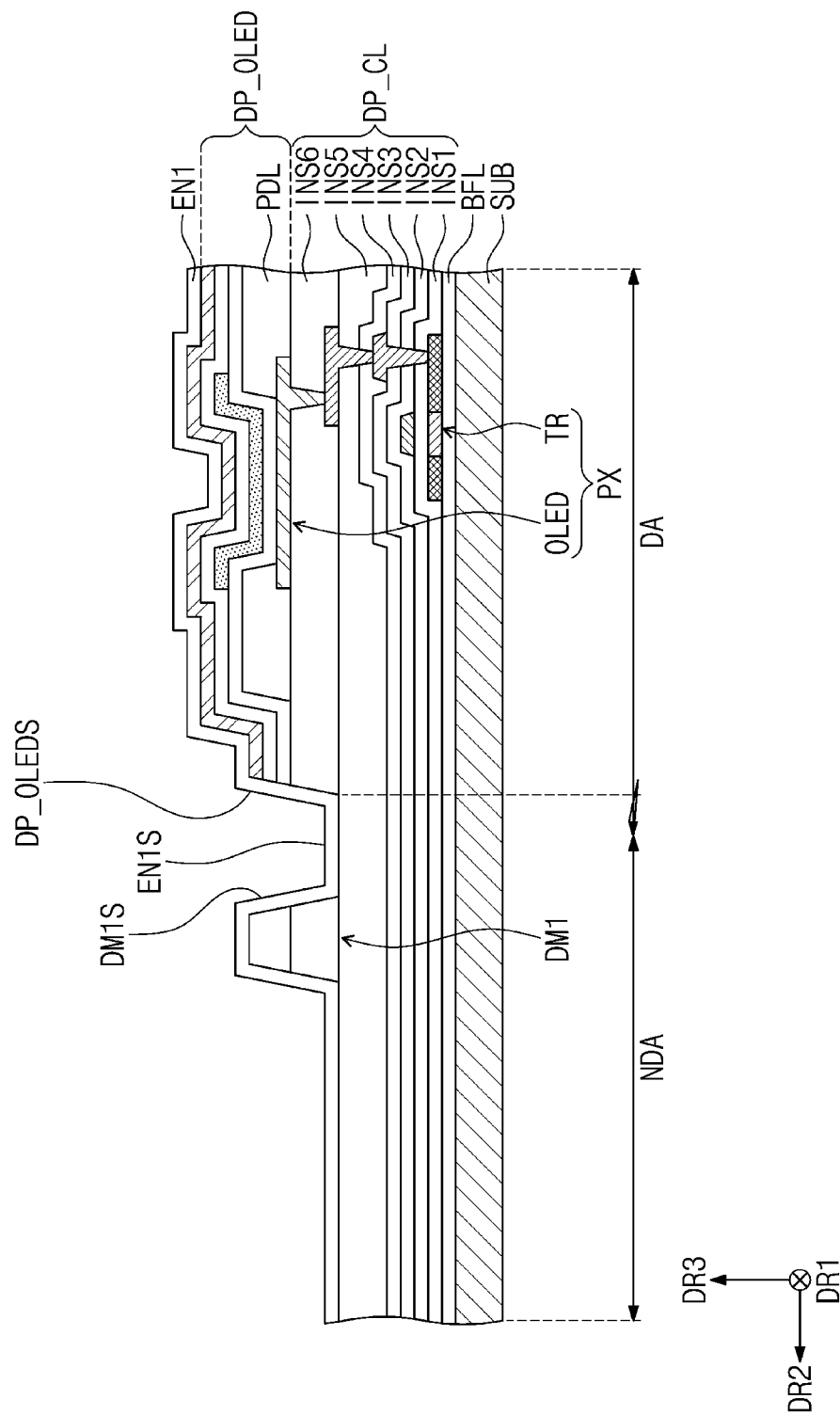
FIGS. 10, 11, 12, 13, and 14 are views explaining a process of inspecting whether a planarization layer is formed on patterns when the planarization layer is formed.

Referring to FIG. 10, the substrate SUB on which the display element layer DP_OLED and the first dam DM1 around the display element layer DP_OLED are disposed may be prepared. The first encapsulation layer EN1 may then be formed over the display area DA and the non-display area NDA.

Figure 11:
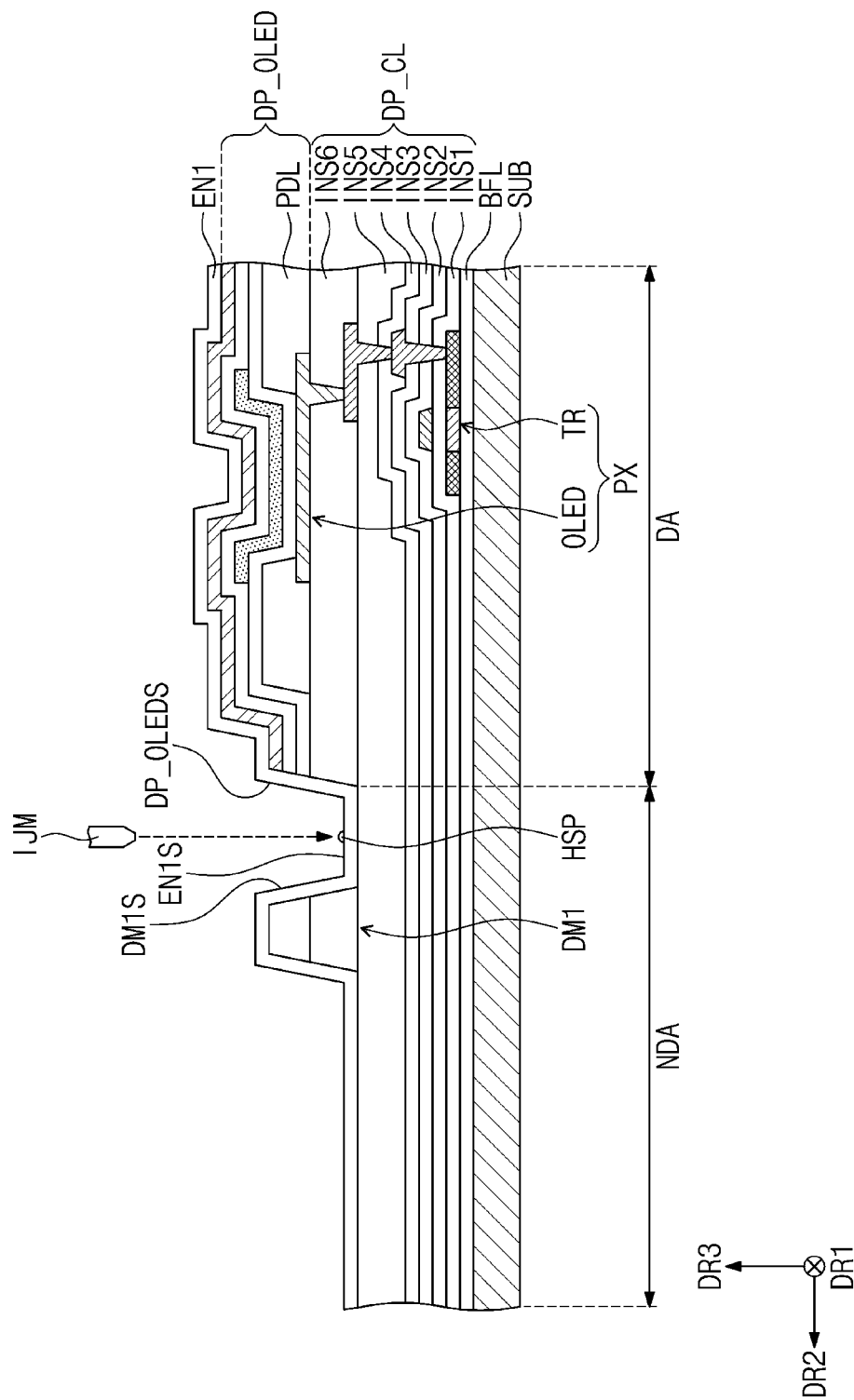

Referring to FIG. 11, an inkjet process may be performed by an inkjet device IJM. The inkjet device IJM may be disposed above the first encapsulation layer EN1 disposed between the first dam DM1 and the display element layer DP_OLED and may be spaced apart from the first encapsulation layer EN1 in the third direction DR3.

The inkjet device IJM may perform the inkjet process to form the patterns HSP between the first dam DM1 and the display element layer DP_OLED. In other words, the patterns HSP may be disposed on the flat surface EN1S between the first inclined surface DM1S and the second inclined surface DP_OLEDS. The inkjet device IJM may repeatedly perform the inkjet process while moving, and thus, a number of the patterns HSP may be formed.

The patterns HSP may be formed on the flat surface EN1S along a periphery of the display area DA. As an example, the patterns HSP are disposed on the first encapsulation layer EN1; however, the position of the patterns HSP should not be limited thereto or thereby. In other words, the patterns HSP may be disposed at various positions, such as an upper surface of the fifth insulating layer INS5, an upper surface of lines formed in the non-display area NDA, etc.

Figure 12:
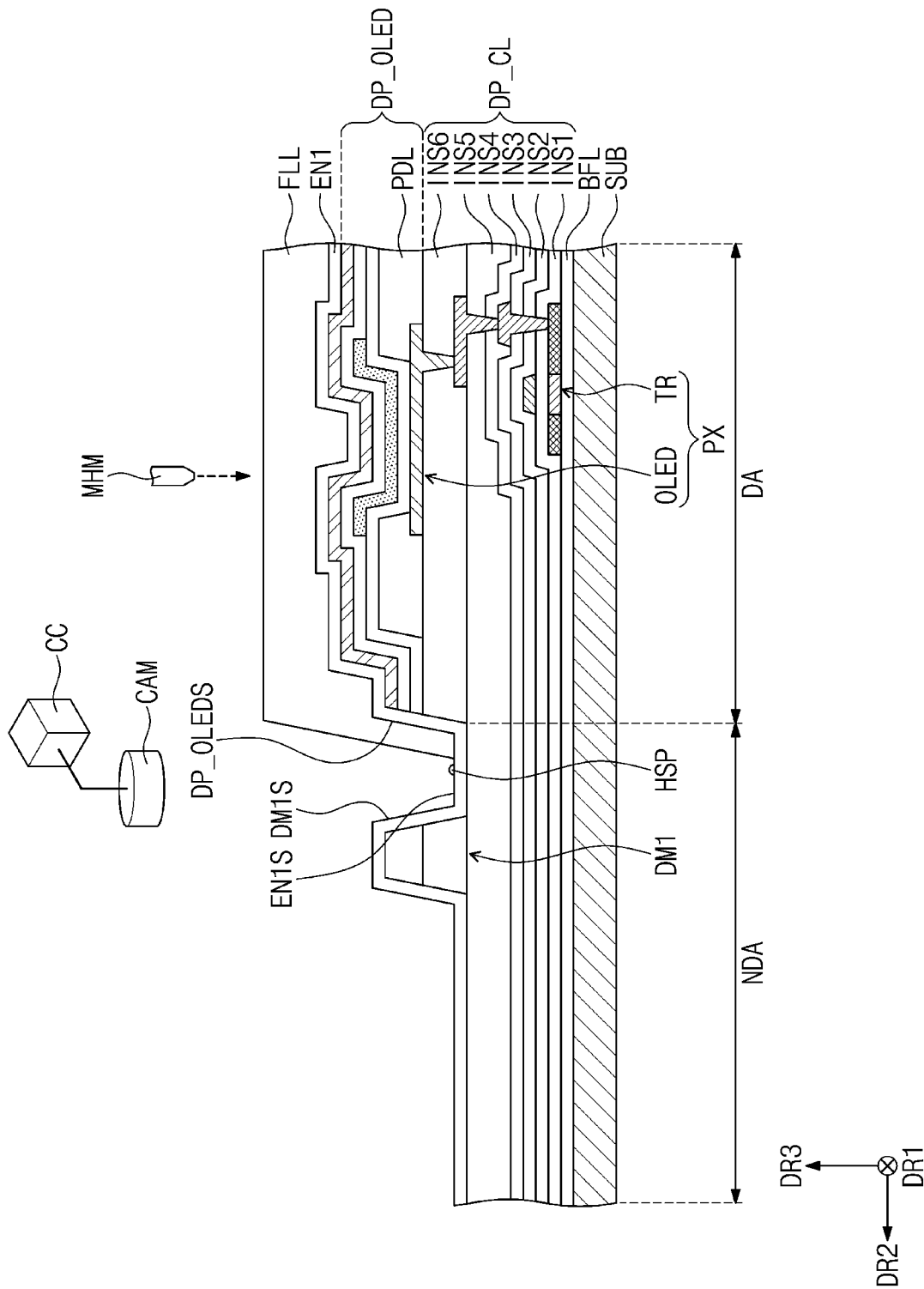

Referring to FIG. 12, a monomer device MHM may be disposed above the display element layer DP_OLED and may be spaced apart from the display element layer DP_OLED in the third direction DR3. The monomer device MHM may perform the inkjet process to provide the organic material on the first encapsulation layer EN1. The organic material may be cured to form the planarization layer FLL.

The monomer device MHM may repeatedly perform the inkjet process while moving, and thus, may form the planarization layer FLL all over the display element layer DP_OLED. The planarization layer FLL may be disposed to overlap the display element layer DP_OLED. The monomer device MHM may perform the inkjet process to allow the planarization layer FLL to be disposed only on the display element layer DP OLED.

The planarization layer FLL including the organic material may be disposed on the display element layer DP_OLED overlapping the display area DA and may be disposed on the non-display area NDA in addition to the display area DA. For example, the organic material used to form the planarization layer FLL may overflow onto the flat surface EN1S provided in the non-display area NDA after passing the second inclined surface DP_OLEDS.

The camera CAM may be disposed above the flat surface ENiS between the first inclined surface DM1S and the second inclined surface DP_OLEDS and may be spaced apart from the flat surface EN1S in the third direction DR3. The camera CAM may be disposed above the patterns HSP; however, it should not be limited thereto or thereby. As another example, the camera CAM may be disposed at a position where the camera CAM may photograph an entire portion of the patterns HSP.

The camera CAM may photograph the patterns HSP. For example, the camera CAM may photograph the entire portion of the patterns HSP.

A controller CC may receive an image obtained by photographing the patterns HSP from the camera CAM. The controller CC may inspect the image provided from the camera CAM to check whether the moiré pattern HSP_MR is formed in the patterns HSP. The controller CC may check whether the moiré pattern HSP_MR is formed to determine whether the organic material is disposed on the patterns HSP. In other words, it is determined that the planarization layer FLL is in contact with the patterns HSP when the moiré pattern HSP_MR is present.

The controller CC may be connected to the camera CAM by a communication cable, however, this is merely one example, and the connection relation between the controller CC and the camera CAM should not be limited thereto or thereby. As an example, the controller CC may receive the image from the camera CAM via a wireless communication link. The controller CC may be a computer that includes a communication interface to communicate with the camera CAM and a processor, however, it should not be limited thereto or thereby.

Since the planarization layer FLL is not disposed on the patterns HSP in FIG. 12, the moiré pattern HSP_MR may not be formed in the patterns HSP photographed by the camera CAM. Accordingly, the controller CC may determine that the planarization layer FLL is not in contact with the patterns HSP.

Figure 13:
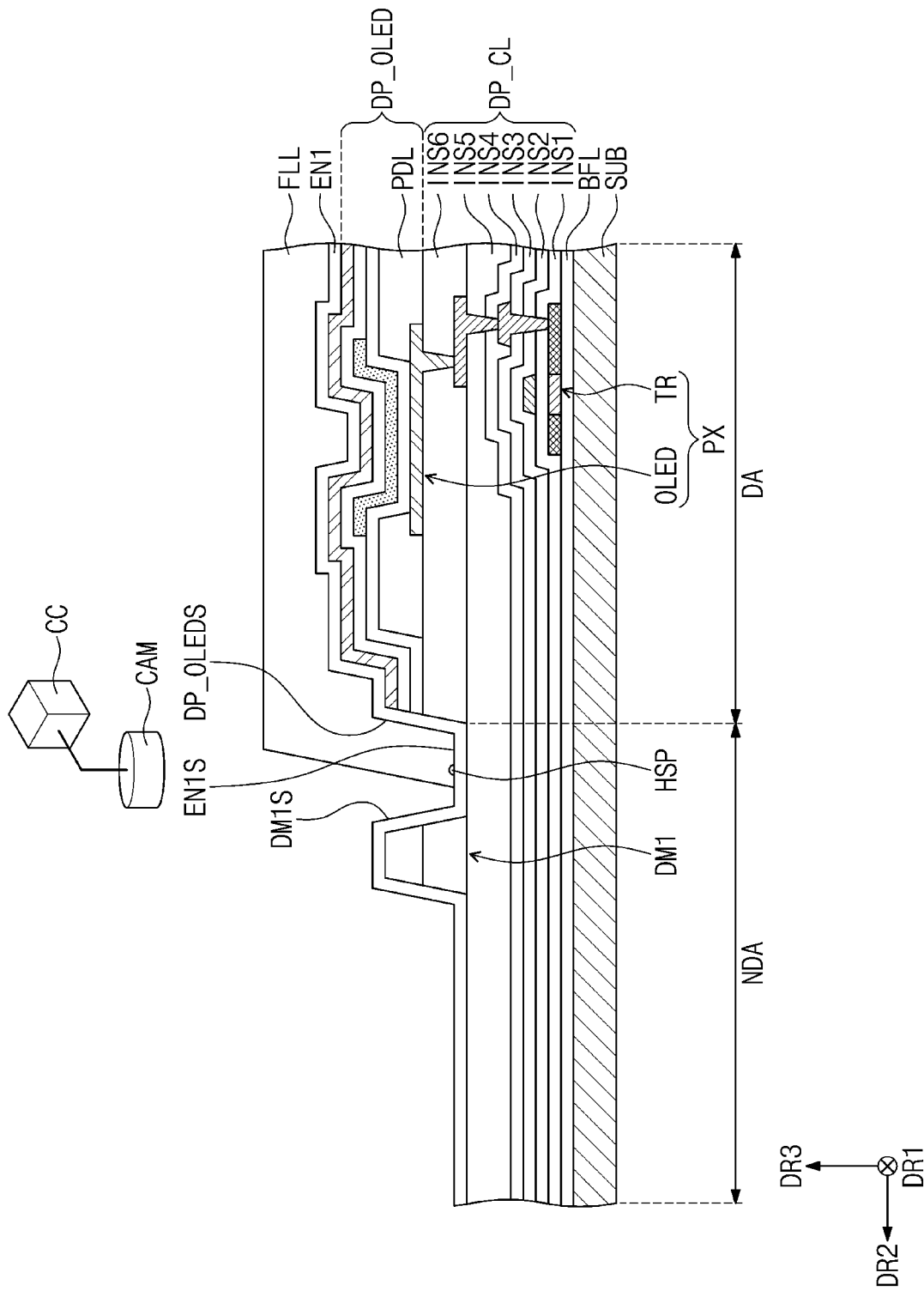

Referring to FIG. 13, the planarization layer FLL may be formed on both the display area DA and the flat surface EN1S. In this case, the planarization layer FLL may cover the patterns HSP.

The camera CAM may photograph the patterns HSP on which the planarization layer FLL is disposed, and the controller CC may receive the photographed image from the camera CAM to check whether the moiré pattern HSP_MR is formed in the patterns HSP.

The controller CC may check the number of patterns HSP in which the moiré pattern HSP_MR is formed. If the number of patterns HSP in which the moiré pattern HSP_MR is formed is greater than a reference number of the patterns HSP, the controller CC may display a notification indicating that it is defective. If the number of patterns HSP in which the moiré pattern HSP_MR is formed is equal to or smaller than the reference number of the patterns HSP, the controller CC may not display the notification. In other words, the display device DD is determined as a non-defective product in which the planarization layer FLL is normally formed. The reference number of patterns HSP used to determine whether the planarization layer FLL is normal may be set to about 60% of the total number of patterns HSP; however, it should not be limited thereto or thereby. As another example, the reference number of patterns HSP may be set in a range from about 50% to about 70% of the total number of patterns HSP.

According to the present disclosure, the extent of the formation of the planarization layer FLL on the flat surface EN1S may be precisely determined using the controller CC. Since it can be determined whether the planarization layer FLL is formed on the flat surface EN1S, the planarization layer FLL may be prevented from being formed beyond the first dam DM1. Accordingly, an additional dam structure may not be used to prevent the planarization layer FLL from being formed beyond the first dam DM1. Since the area in which the dam structure is placed is reduced, a dead space of the display device DD may be reduced.

Figure 14:
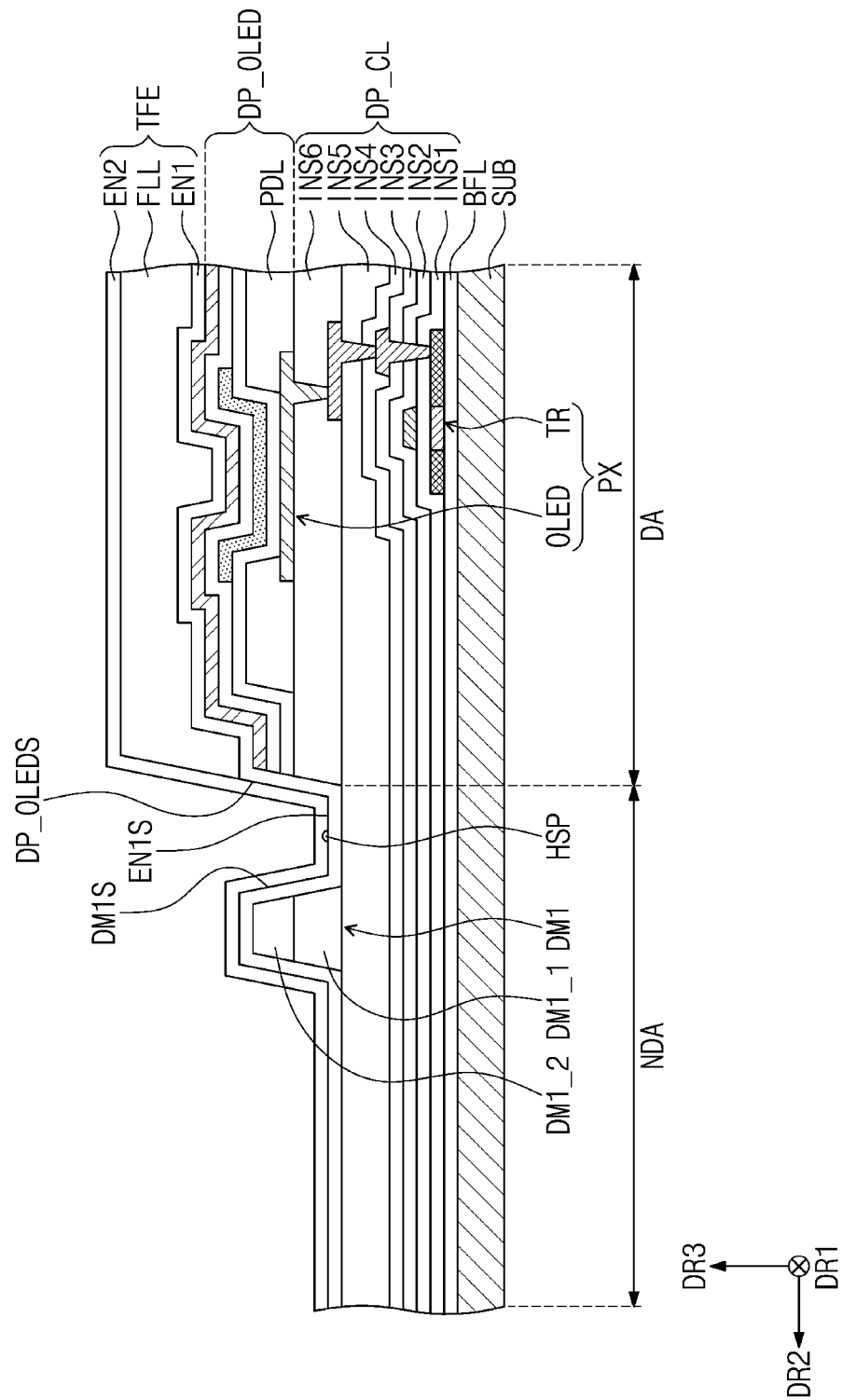

Referring to FIG. 14, the display device DD in which the planarization layer FLL is normally formed may be prepared. The second encapsulation layer EN2 may be disposed on the planarization layer FLL. The second encapsulation layer EN2 may extend to the non-display area NDA and may be disposed on the planarization layer FLL and the first encapsulation layer EN1.

FIG. 15A is a plan view showing a portion of a first encapsulation layer EN1 of FIG. 7 according to an embodiment of the present disclosure. In FIG. 15A, the same reference numerals denote the same elements in FIG. 7, and thus, detailed descriptions of the same elements will be omitted.

Referring to FIG. 15A, patterns HSP may be arranged at regular intervals and may be disposed adjacent to a first inclined surface DM1S. For example, a first column of patterns HSP may be formed next to the first inclined surface DM1S. In addition, a second column of patterns HSP may be disposed between the first column of patterns HSP and a second inclined surface DP_OLEDS. In other words, the patterns HSP may be arranged on a flat surface EN1S between a first dam DM1 and a display element layer DP_OLED in a matrix form. FIG. 15A shows ten patterns HSP (five in each column) as a representative example, however, the number of the patterns HSP should not be limited to ten.

The patterns HSP disposed adjacent to the second inclined surface DP_OLEDS, for example, the second column of patterns HSP, may be in contact with a first encapsulation layer EN1 formed up to the flat surface EN1S after passing the second inclined surface DP_OLEDS, and thus, the moiré pattern HSP_MR may be formed in the second column of patterns HSP.

In the case where the first and second columns of patterns HSP do not form the moiré pattern HSP_MR, the controller CC may determine that the planarization layer FLL is formed only on the display element layer DP_OLED or the planarization layer FLL is formed to between the second inclined surface DP_OLEDS and the second column of patterns HSP.

In the case where only the patterns HSP adjacent to the second inclined surface DP_OLEDS, e.g., the second column of patterns HSP, form the moiré pattern HSP_MR, the controller CC may determine that the planarization layer FLL is formed from the display element layer DP_OLED to an area between the patterns HSP adjacent to the first inclined surface DM1S, e.g., the first column of patterns, and the second column of patterns HSP.

In the case where the first column of patterns HSP and the second column of patterns HSP form the moiré pattern HSP_MR, the controller CC may determine that the planarization layer FLL is formed up to an area adjacent to the first inclined surface DM1S. The position of the planarization layer FLL, which is formed on the flat surface EN1S, may be more precisely determined by the patterns HSP in which the moiré pattern HSP_MR is formed in the second direction DR2.

FIG. 15B is a plan view showing a portion of a first encapsulation layer of FIG. 7 according to an embodiment of the present disclosure. In FIG. 15B, the same reference numerals denote the same elements in FIG. 7, and thus, detailed descriptions of the same elements will be omitted.

Referring to FIG. 15B, first patterns HSP_1 may be disposed adjacent to a display element layer DP_OLED on a first encapsulation layer EN1. In other words, the first patterns HSP_1 may be disposed adjacent to a second inclined surface DP_OLEDS.

Second patterns HSP_2 may be disposed on the first encapsulation layer EN1 and may be disposed farther from the display element layer DP_OLED than the first patterns HSP_1 are. In other words, the second patterns HSP_2 may be disposed closer to the first inclined surface DM1S. The first patterns HSP_1 and the second patterns HSP_2 may be arranged in a staggered fashion with respect to one another.

As described with reference to FIG. 15A, the position of the planarization layer FLL formed on a flat surface EN1S may be determined more precisely by checking whether the moiré pattern HSP_MR is formed in the first and second patterns HSP_1 and HSP_2. However, since the first and second patterns HSP_1 and HSP_2 are arranged in a zigzag shape along the first direction DR1, the process of forming the first and second patterns HSP_1 and HSP_2 may be simplified. Accordingly, the cost and time of the process may be reduced.

Although the embodiments of the present disclosure have been described, it is understood that the present disclosure should not be limited to these embodiments but various changes and modifications can be made by one ordinary skilled in the art. Therefore, the disclosed subject matter should not be limited to any single embodiment described herein.

What is claimed is:

1. A display device, comprising:
a substrate;
a display element layer disposed on the substrate;
a dam disposed around the display element layer;
a plurality of patterns disposed between the dam and the display element layer; and
a planarization layer disposed on the display element layer and the patterns, wherein the patterns have a hydrophile-lipophile balance value different from a hydrophile-lipophile balance value of the planarization layer.

2. The display device of claim 1, further comprising:
a first encapsulation layer disposed on the display element layer; and
a second encapsulation layer disposed on the first encapsulation layer, wherein the planarization layer is disposed between the first encapsulation layer and the second encapsulation layer.

3. The display device of claim 2, wherein the first encapsulation layer and the second encapsulation layer are disposed on the dam, and the patterns are spaced apart from each other on the first encapsulation layer.

4. The display device of claim 3, wherein the planarization layer is spaced apart from the dam.

5. The display device of claim 4, wherein a number of the patterns on which the planarization layer is disposed is equal to or smaller than about 60% of a total number of the patterns.

6. The display device of claim 1, wherein the patterns have a lipophilicity, and the planarization layer has a hydrophilicity.

7. The display device of claim 6, wherein the hydrophile-lipophile balance value of the planarization layer is within a range from about 15 to about 20.

8. The display device of claim 6, wherein the hydrophile-lipophile balance value of the patterns is within a range from about 0 to about 5.

9. The display device of claim 1, wherein the patterns have a hydrophilicity, and the planarization layer has a lipophilicity.

10. The display device of claim 1, wherein the patterns are disposed in a matrix form.

11. The display device of claim 1, wherein the patterns comprise:

first patterns disposed adjacent to the display element layer; and second patterns disposed adjacent to the dam, and the first patterns and the second patterns are arranged staggered with respect to one another.

* * * * *